US008044492B2

(12) United States Patent
Imanishi et al.

(10) Patent No.: US 8,044,492 B2
(45) Date of Patent: Oct. 25, 2011

(54) COMPOUND SEMICONDUCTOR DEVICE INCLUDING AlN LAYER OF CONTROLLED SKEWNESS (75) Inventors: Kenji Imanishi, Kawasaki (JP); Toshihide Kikkawa, Kawasaki (JP); Takeshi Tanaka, Tokai (JP); Yoshihiko Moriya, Hitachi (JP); Yohei Otoki, Hitachi (JP)

(73) Assignees: Fujitsu Limited, Kawasaki (JP); Hitachi Cable Co., Ltd., Tokyo (JP)

( * ) Notice: Subject to any disclaimer, the term of this patent is extended or adjusted under 35 U.S.C. 154(b) by 419 days.

(21) Appl. No.: 12/059,693

(22) Filed: Mar. 31, 2008

(65) Prior Publication Data
US 2008/0237610 A1 Oct. 2, 2008

(30) Foreign Application Priority Data

Mar. 30, 2007 (JP) ................. 2007-093574

(51) Int. Cl.
*H01L 29/30* (2006.01)
*H01L 33/22* (2010.01)
(52) U.S. Cl. .................. 257/615; 257/618; 257/E29.108
(58) Field of Classification Search .......... 257/E29.068–E29.322, 213–413; 438/142–378
See application file for complete search history.

(56) References Cited

U.S. PATENT DOCUMENTS

| 2006/0043396 A1* | 3/2006 | Tsuda et al. ............... 257/94 |
| 2006/0220039 A1* | 10/2006 | Yokoyama et al. ......... 257/85 |
| 2008/0197359 A1* | 8/2008 | Imanishi et al. ............. 257/76 |

FOREIGN PATENT DOCUMENTS

| JP | 2003-309071 A | 10/2003 |
| JP | 2005-032823 A | 2/2005 |
| JP | 2005-183524 A | 7/2005 |
| JP | 2006-165207 A | 6/2006 |
| WO | 2005/036658 A1 | 4/2005 |

OTHER PUBLICATIONS

Chinese Office Action dated Jun. 19, 2009, issued in corresponding Chinese Patent Application No. 200810090314.

* cited by examiner

*Primary Examiner* — Stephen W Smoot
(74) *Attorney, Agent, or Firm* — Westerman, Hattori, Daniels & Adrian, LLP (57) ABSTRACT A semiconductor epitaxial substrate includes: a single crystal substrate; an AlN layer epitaxially grown on the single crystal substrate; and a nitride semiconductor layer epitaxially grown on the AN layer, wherein an interface between the AlN layer and nitride semiconductor layer has a larger roughness than an interface between the single crystal substrate and AlN layer, and a skewness of the upper surface of the AlN layer is positive.

7 Claims, 5 Drawing Sheets

COMPOUND SEMICONDUCTOR DEVICE INCLUDING AlN LAYER OF CONTROLLED SKEWNESS

CROSS REFERENCE TO RELATED APPLICATION

This application is based on and claims priority of Japanese Patent Application No. 2007-093574 filed on Mar. 30, 2007, the entire contents of which are incorporated herein by reference.

BACKGROUND OF THE INVENTION

A) Field of the Invention

The present invention relates to a compound semiconductor epitaxial substrate, a compound semiconductor device and their manufacture method, and more particularly to a compound semiconductor epitaxial substrate and a compound semiconductor device having a nitride semiconductor layer, and their manufacture method.

B) Description of the Related Art

GaN has a broad band gap of 3.4 eV and is a semiconductor expected for short wavelength optical emission and high breakdown voltage operation. Optical emission devices for ultraviolet and blue light have been developed. High voltage operation is required for a base station amplifier of mobile phones. A value over 300 V is presently reported as a breakdown voltage during current-off. The best output characteristics are obtained by using an SiC substrate. This is considered to be ascribed to a high thermal conductivity of SiC. Physical characteristics such as a band gap are adjusted in group-III nitride mixed crystals. For example, AN or InN is mixed in GaN. $Ga_xAl_yIn_zN$ ($0<x\leq1$, $x+y+z=1$) is herein called gallium nitride containing (GaN containing) semiconductor. Various epitaxial growth has been studied in order to form a group-III nitride semiconductor crystal layer of good quality.

JP-A-2003-309071 proposes that an AlN low temperature growth buffer layer of 10 nm to 50 nm thick is grown on a crystal substrate such as sapphire, SiC, GaN and AlN, e.g., a sapphire substrate, at a low temperature of 300° C. to 600° C., after the temperature is raised to, e.g, 1000° C. an $Al_xGa_{1-x}N$ ($0<x\leq1$) underlying layer is grown on the low temperature growth buffer layer, and an $Al_yGa_{1-y}N$ ($0\leq y<x$) with a lower Al composition is grown on the underlying layer. Since the AlGaN film with a lower Al composition has a large lattice constant, a compressive stress is applied. It is described that a GaN layer and the like of good quality can be obtained because dislocation is deflected laterally at a film interface. The device structure described is an ultraviolet emission LED. When a multiquantum well structure is formed, a growth temperature is set to 800° C. for example.

JP-A-2005-32823, which is incorporated herein by reference, proposes that when a field effect transistor epitaxial wafer is formed by growing an AlN buffer layer on an SiC substrate and growing a GaN or InGaN channel layer and an AlGaN electron supply layer on the AlN buffer layer, a growth temperature of the buffer layer is set higher by about 100° C. than that for the channel layer, and a V/III ratio is lowered during the growth to the extent that adhesion and release speeds of AlN reactive species become equal, preferably not smaller than 50 and not larger than 500.

As the growth temperature is raised, AlN reactive species are activated so that release become easy. As the V/III ratio is lowered, a growth speed of the AlN buffer layer is suppressed low, and a state near an equilibrium state is formed in which AlN reactive species become easy to move on the surface. Therefore, not only two-dimensional nucleation is promoted but also a pit burying function is enhanced after the AlN crystal film is formed. It is described that growth of an AlN buffer layer with less detects can be realized. The AlN buffer layer is grown by MOCVD under the conditions of a furnace pressure of 135 Torr, a V/III ratio of 230 and a growth temperature of 1150° C. to 1200° C. using trimethylaluminum (TMA) as Al source and $NH_3$ as nitrogen source. A growth speed is 0.2 nm/sec or slower. Thereafter, the temperature is lowered to 1100° C., and other layers such as a high purity GaN layer are grown epitaxially.

JP-A-2006-165207, which is incorporated herein by reference, proposes a high electron mobility transistor (HEMT) of high breakdown voltage using GaN containing semiconductor as a channel layer. For example, an i-type GaN channel layer is grown above a high resistance SiC substrate, an n-type AlGaN layer and an n-type GaN cap layer are formed with an i-type AlGaN spacer layer interposed therebetween, the n-type cap layer is partially removed, Ta and Al are laminated to form source/drain electrodes of ohmic electrodes through annealing at 510° C. or higher and lower than 600° C., an SiN layer is deposited, an opening is formed through the SiN layer, and a gate electrode contacting the GaN cap layer is formed in the opening.

SUMMARY OF THE INVENTION

According to one aspect of an embodiment, there is provided a semiconductor epitaxial substrate including:

a single crystal substrate; an AlN layer epitaxially grown on the single crystal substrate; and a nitride semiconductor layer epitaxially grown on the AlN layer, wherein an interface between the AlN layer and the nitride semiconductor layer has a larger roughness than an interface between the single crystal substrate and the AlN layer.

According to another aspect of an embodiment, there is provided a compound semiconductor device including:

a single crystal substrate; an AlN layer epitaxially grown on the single crystal substrate;

a buffer layer of nitride semiconductor epitaxially grown on the AlN layer;

a channel layer of nitride semiconductor epitaxially grown on the buffer layer;

a carrier supply layer of nitride semiconductor epitaxially grown on the channel layer; and a source electrode, a drain electrode and a gate electrode formed above the carrier supply layer, wherein an interface between the AlN layer and the buffer layer has a larger roughness than an interface between the single crystal substrate and the AlN layer.

According to further aspect of an embodiment, there is provided a manufacture method for a semiconductor epitaxial substrate including:

epitaxially growing an AlN layer on a single crystal substrate; and epitaxially growing a nitride semiconductor layer on the AlN layer, wherein growth conditions for the AlN layer are set in such a manner that an interface between the AlN layer and the nitride semiconductor layer has a larger roughness than an interface between the single crystal substrate and the AlN layer.

According to still another aspect of an embodiment, there is provided a manufacture method for a compound semiconductor device including:

epitaxially growing an AlN layer on a single crystal substrate;

epitaxially growing a buffer layer of nitride semiconductor on the AlN layer;

epitaxially growing a channel layer of nitride semiconductor on the buffer layer;

epitaxially growing a carrier supply layer of nitride semiconductor on the channel layer; and forming a source electrode, a drain electrode and a gate electrode above the carrier supply layer, wherein growth conditions for the AlN layer are set in such a manner that an interface between the AlN layer and the buffer layer has a larger roughness than an interface between the single crystal substrate and the AlN layer.

DESCRIPTION OF THE PREFERRED EMBODIMENTS

One of the present assignees has proposed a method of growing an AlN layer on an SiC layer at a growth temperature of 1100° C. to 1200° C. and forming a GaN containing HEMT device layer on the AlN layer. The GaN containing HEMT formed by this growth method has demonstrated the phenomenon that a drain current reduces after interruption of a high frequency signal and the device recovers not readily. The present inventors assumed that the cause of this phenomenon was carrier trap centers (traps) by crystal defects, and tried to develop a growth method of forming less crystal defects.

Figure 1A:
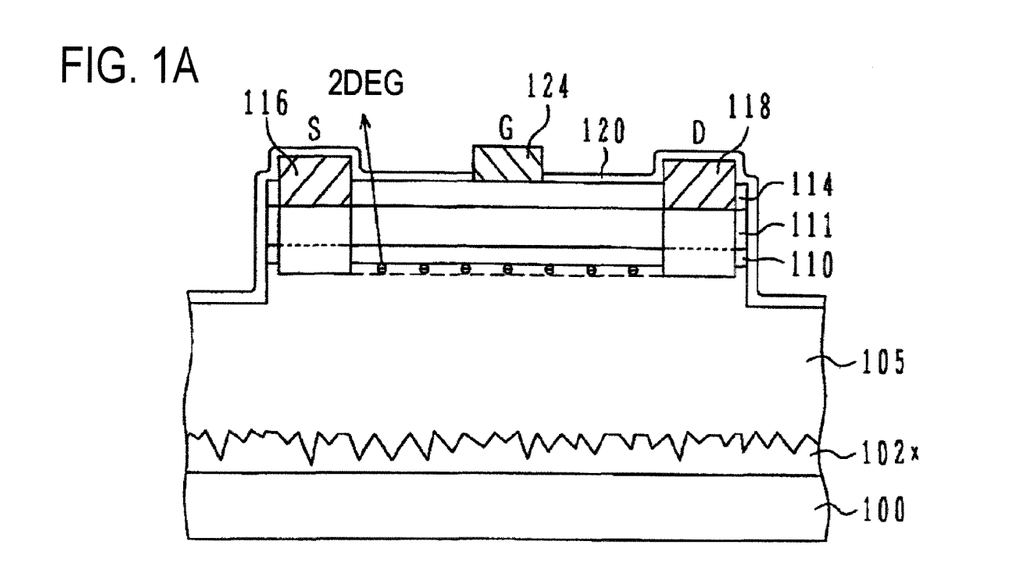
FIGS. 1A and 1B are schematic cross sectional views showing the structures of GaN containing HEMT's according to a first embodiment of the present invention and a comparative example.

FIG. 1A is a schematic cross sectional view showing the structure of a GaN containing HEMT according to the first embodiment of the present invention. Nitride semiconductor crystal layers are laminated on a single crystal SiC substrate 100 by using a low pressure (LP) metal organic chemical vapor deposition (MOCVD) system of vertical gas flow. Lamination layer forming process will be described hereunder. First, an SiC substrate 100 subjected to a surface cleaning process is placed in a growth system which is controlled to have a constant pressure of 50 Torr by an evacuation pump system while hydrogen is flowed through the growth system. The substrate is heated to a temperature of 1150° C. in a hydrogen gas atmosphere and left for 10 minutes. Thermal cleaning of the substrate can be expected by this process. Next, a valve is turned over to flow trimethylaluminum (TMA) and ammonium ($NH_3$) gas into the reaction chamber to form an i-type AlN layer 102x. A ratio of a TMA molar concentration to an ammonium molar concentration, a so-called V/III ratio, was set to 3000. At this ratio, a film forming speed of the AlN layer was about 0.2 nm/sec. A film forming speed is generally determined by a TMA molar concentration. However, the film forming speed of the AlN layer is influenced also by an ammonium molar concentration, a growth temperature and a growth pressure, because TMA forms an intermediate product depending upon ammonium and a growth temperature. Process parameters such as a growth speed and a V/III ratio are preferably selected so as to grow perfect crystal, forming as less carrier trap centers (traps) as possible, not pursuing flatness of a growth surface. This epitaxial growth is hereinafter called high temperature, high V/III ratio (HT-HR) epitaxial growth.

After the AlN layer is grown to about 30 nm, the valve is turned over to stop the flow of TMA gas and the substrate temperature is lowered linearly to 1050° C. In this case, the ammonium flow rate may be changed to a flow rate suitable for growing the next GaN layer. After 5 minutes of a temperature stabilizing time, trimethylgallium (TMG) gas is flowed to form an i-type GaN layer 105 of 2 μm thick as an electron transport layer. Next, an i-type $Al_{0.3}Ga_{0.7}N$ layer 110 of 3 nm thick is formed by using mixture gas of TMA and TMG, and an Si doped n-type $Al_{0.3}Ga_{0.7}N$ layer 111 of 15 nm is formed by supplying additional silane $SiH_4$. Lastly, an n-type GaN protective layer 114 is grown by using TMG.

A growth temperature of the AlN layer 102x having a preferable thickness range of 20 nm to 40 nm is higher than a growth temperature of 1050° C. ±50° C. of GaN to be later grown, and more specifically, a temperature of 1100° C. to 1200° C. is preferable. At the same time, a high V/III ratio is very important to obtain a low trap center density, and a V/III ratio of higher than 500 would be necessary. The V/III ratio is preferably set in a range about 1000 to 8000. There poses no problem if the growth pressure is in a range of 50 Torr to 300 Torr.

Triethylaluminum (TEA), tritertiarybutyl aluminum (TTBA) or the like may be used as Al source gas, and dimethylhydrazine (DMHy) or the like may be used as nitrogen source gas. Instead of hydrogen, nitrogen or mixture gas of hydrogen and nitrogen may be used as carrier gas.

For growth of the GaN layer, trimethylgallium (TMG) is used as Ga source gas, $NH_3$ is used as nitrogen source gas, and $H_2$ gas is used as carrier gas. Instead, triethylgallium (TEG), dimethylhydrazine or the like may also be used as source gas. The i-type GaN layer 105 having a preferable thickness range of 1 μm to 3 μm serves as the channel layer or electron transport layer of the GaN containing HEMT.

An Al composition x of the i-type $Al_xGa_{1-x}N$ layer 110 and n-type $Al_xGa_{1-x}N$ layer 111 is selected to realize a desired device performance, and is designed in a range of x=0.1 to 1.0. A total thickness is properly designed in a range of about 5 nm to 50 nm in accordance with the selected composition. The i-type AlGaN layer 110 serves as a spacer layer, and the n-type AlGaN layer 111 serves as a carrier supply layer.

Si is suitable for donor of the n-type AlGaN layer, and doped at a carrier concentration of $1\times10^{18}$ $cm^{-3}$ to $5\times10^{18}$ $cm^{-3}$. Doping source material may be silane, disilane, triethylsilane or the like. These two AlGaN layers are not essential but one of them may be omitted if desired electric characteristics can be achieved.

An n-type GaN cap layer 114 of 2 nm to 8 nm thick is formed on a lamination of the AlGaN layers 110 and 111 by MOCVD. The n-type GaN layer gives a suitable Schottky barrier height to the gate electrode. With these processes, an epitaxial substrate for the GaN containing HEMT is formed.

By using a resist mask, the n-type GaN cap layer 114 in the regions where source/drain electrodes are to be formed is etched and removed. A source electrode 116 and a drain electrode 118 of a Ti/Al lamination are formed on the n-type AlGaN layer 111 by lift-off. For example, the lower Ti layer has a thickness of 20 nm, and the upper Al layer has a thickness of 200 nm. The length of the shorter side of the source/drain electrodes 116 and 118 is 1 μm to 2 μm, and the length of the longer side is designed on the basis of device characteristics. The source/drain electrodes are alloyed with the lower nitride semiconductor by a thermal alloying process to form ohmic electrodes connected to two-dimensional electron gas in the i-type GaN layer 105.

An SiN layer 120 of 10 nm to 100 nm thick is deposited by plasma CVD or photo-assisted CVD. A resist film is coated, and an opening is formed therethrough in a gate electrode forming region, by lithography using an electron beam or light. The SiN layer 120 is dry etched, and a gate electrode 124 of an Ni/Au lamination is formed on the n-type GaN cap layer 114 by lift-off. For example, the lower Ni layer is 10 nm thick, and the upper Au layer is 300 nm thick. The length of the shorter side of the gate electrode is designed in a range of 0.1 μm to 3 μm in accordance with desired device characteristics.

A trench is formed to an intermediate depth of the i-type GaN layer 105 by dry etching, surrounding each HEMT element for isolation of each element.

With these processes, a GaN containing HEMT is formed.

Figure 1B:
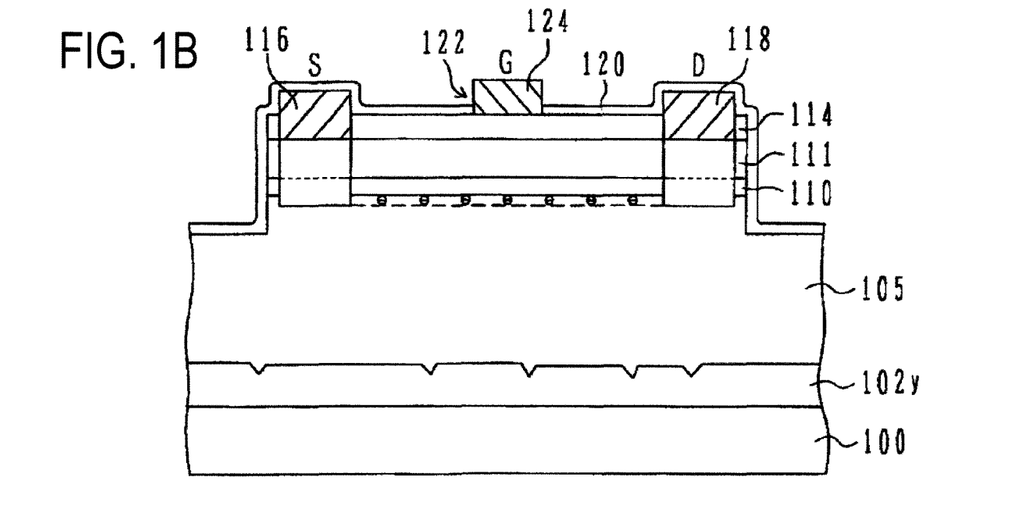

FIG. 1B is a schematic cross sectional view of a GaN containing HEMT of the comparative example. Description will be made mainly on different points from the first embodiment shown in FIG. 1A. Nitride semiconductor crystal layers are laminated on a single crystal SiC substrate 100 by using a low pressure (LP) metal organic chemical vapor deposition (MOCVD) system of vertical gas flow type. These processes will be described hereunder.

First, an SiC substrate 100 subjected to a surface cleaning process is placed in a growth system which is controlled to have a constant pressure of 135 Torr by an evacuation pump system while hydrogen is flowed through the growth system. The substrate is heated to a temperature of 1200° C. in a hydrogen gas atmosphere and left for 10 minutes. Thermal cleaning of the substrate can be expected by this process. Next, a valve is turned over to flow trimethylaluminum (TMA) and ammonium ($NH_3$) gas into the reaction chamber to form an i-type AlN layer 102y. A ratio of a TMA molar concentration to an ammonium molar concentration, a so-called V/III ratio, was set to 230. At this ratio, a film forming speed of the AlN layer 102y was about 0.2 nm/sec. This film forming speed is accidentally coincident with that of the embodiment, by the interaction of a variety of parameters.

In the comparative example, process parameters such as a growth speed and a V/III ratio are selected by paying attention to the flatness of a growth surface. For example, a relatively thick film is formed because as an AlN film thickness becomes thicker, flatness becomes better. In the comparative example, a thickness was set to 100 nm. Other structures are similar to those of the first embodiment.

Samples of the first embodiment and the comparative example having a gate width (longer side) of 1 mm were formed. The source electrode 116 was grounded, 50 V was applied to the drain electrode, a d.c. gate bias voltage was set to obtain a drain current of about 10 mA, and a very small a.c. signal of 2 GHz was applied to the gate electrode. An amplified a.c. signal is detected from the drain. For example, at an input signal level of 16 dB to 18 dB, an output signal of 36 dB to 38 dB is obtained. After an a.c. signal has been superposed upon a d.c. gate bias, only the a.c. signal was interrupted.

Figure 2A:
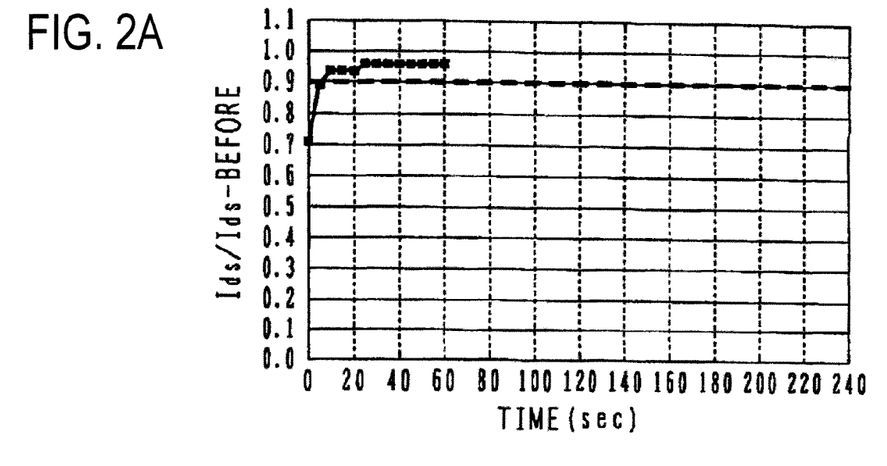
FIGS. 2A and 2B are graphs showing a change in a drain current after interruption of an high frequency signal in samples according to the first embodiment and the comparative example.
Figure 2B:
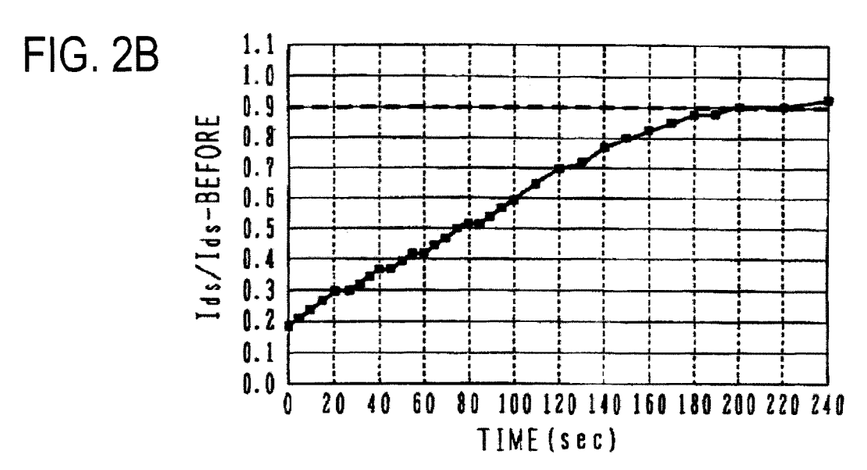

FIGS. 2A and 2B are graphs showing an example of a drain current change after interruption of an a.c. signal of the samples of the first embodiment and comparative example. The ordinate represents a ratio of a drain current Ids after interruption of an a.c. signal to a drain current Ids-BEFORE before application of an a.c. signal, and the abscissa represents a time after interruption of an a.c. signal in the unit of second. In the comparative example shown in FIG. 2B, a drain current of 10 mA before application of an a.c. signal reduces to about 1 mA to 4 mA, and thereafter gradually recovers in 1 to 4 minutes. After interruption of an a.c. signal, a transient response time of one minute or longer is required, which is a critical obstacle against high frequency on/off operations. In the state that a high frequency signal is applied at a drain bias of 50 V, a voltage of about 150 V at the maximum is applied in HEMT. This state is considered as a high voltage and high electric field state having a broadened depletion layer. It is considered that two-dimensional electron gas is captured in traps and cannot move because of the high voltage and high electric field, a quantity of the two-dimensional electron gas is reduced under the gate electrode and the current reduces, and thereafter electrons are gradually released from the traps to gradually recover the current. In the sample of the first embodiment shown in FIG. 2A, reduction in the drain current after interruption of an a.c. signal is suppressed to about 10%, and the drain current recovers in about 5 to 15 seconds. Although not perfect, considerable improvement is achieved as compared to the characteristics shown in FIG. 2B.

Figure 3A:
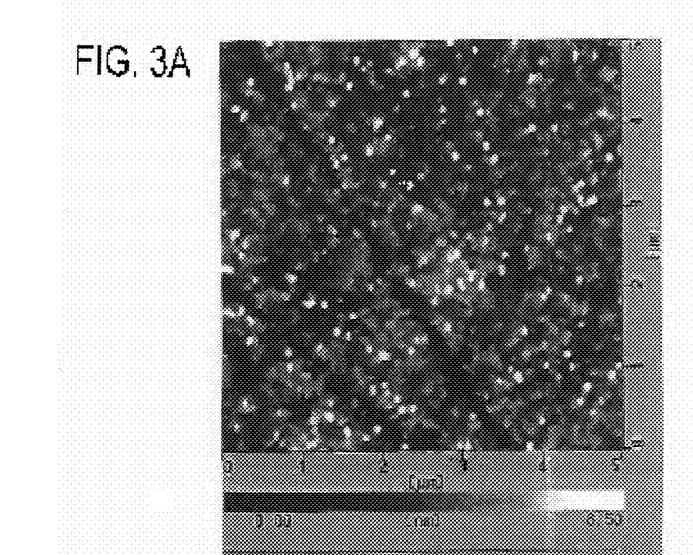
FIGS. 3A and 3B are images showing surface morphology of an area of 5 μm×5 μm observed with an atomic force microscope.
Figures 3B, 3D:
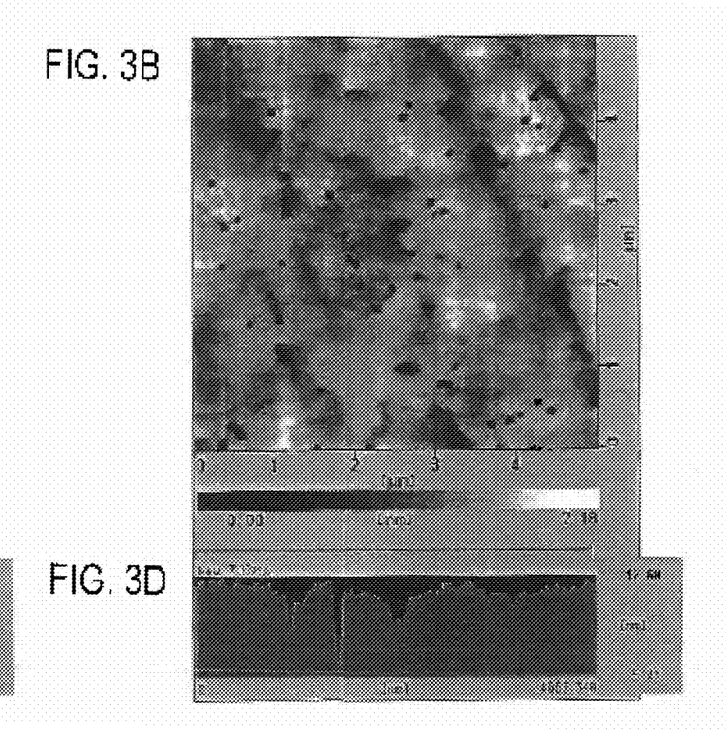
FIGS. 3C and 3D are graphs showing a surface height change scanned with the atomic force microscope by about 4.7 μm in one direction.
Figure 3C:
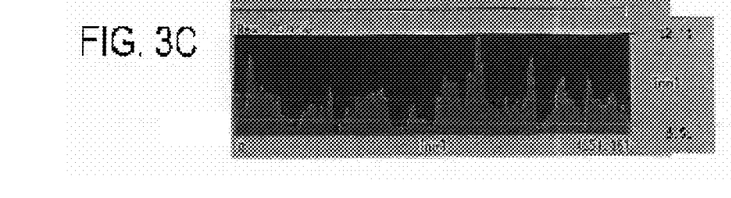

In order to investigate this phenomenon, crystalline states of the AlN layers 102x and 102y formed under different film forming conditions were investigated. FIGS. 3A and 3B are images showing the surface morphology of respective areas of 5 μm×5 μm observed with an atomic force microscope. FIGS. 3C and 3D are graphs showing surface height changes respectively scanned with the atomic force microscope by about 4.7 μm in one direction. The surface of the AlN layer 102x of the sample of the first embodiment shown in FIGS. 3A and 3C has unevenness constituted of a number of projections projecting from the lower side to the upper side, uniformly distributed on the whole surface (in this cross section, there are observed seven especially sharp edged projection). Each projection has a width narrower than 200 nm and has a sharp top edge. Relative to an average height, a height of the convex portion is about 6 nm at the maximum, and a height of the concave portion is less than 3 nm. It is characteristic that a number of projections exist extending mainly upwards from the average height.

The surface of the AlN layer 102y of the sample of the comparative example shown in FIGS. 3B and 3D has many plateaus or flat top portions, having a width of 200 nm or wider including among others a plateau or flat top portion having a width of 1000 nm or wider. Relative to an average height, a height of the upwardly convex portion is 2 nm at the maximum. Only three remarkable valley or concave portions exist in this cross section, including some valleys or concave portions reaching a depth of 10 nm. It is characteristic that relatively broad plateaus or flat top portions exist and deep valleys or holes are formed extending downwards from the plateau or flat top portion.

As compared to the sample of the comparative example, it can be said that the sample of the first embodiment is characterized in no plateau or protrusion having a width of 200 nm or wider, a number of projections or convex portions having a height of 3 nm or higher relative to the average height, and a depth of the concave portions being smaller than 3 nm relative to the average height.

It is preferable to use an index of Rsk (skewness of a roughness curve) or Psk (skewness of a cross sectional curve) as a mathematical index representative of a difference between two types of surface roughness. A skewness is a physical quantity (absolute number) obtained by dividing an average of cubic of height deviation Z(x) along a reference length by cubic of root mean square of height deviation Z(x).

Calculation results are Rsk=+0.84 for the first embodiment, and Rsk=−2.95 for the comparative example.

The surface morphology having a positive Rsk indicates existence of rough surface portions (mainly convex portions) sharply projecting upwards, and the surface morphology having a negative Rsk indicates existence of rough surface portions (mainly concave portions) sharply falling or depressing downwards. The skewness Rsk is preferably positive, and more preferably 0.5 or higher.

The uneven surface portions can obviously be observed not only just after the AlN layers 102x and 102y are formed, but also after epitaxial growth on the AlN layer or after completion of the device structure through cross section observation evaluation. The uneven or rough portions can also be detected through non-destructive diffraction intensity evaluation using X-rays. For example, a ratio of a diffraction intensity of an AlN thin film having the same thickness relative to a diffraction intensity of a GaN layer, is considerably lower for the AlN layer having a large roughness than for the AlN layer having a small roughness.

The comparative example reduces the drain current greatly after application of a high frequency signal, although the flatness of the surface of the AlN layer is definitely superior to that of the first embodiment. This phenomenon may be ascribed to that the number of carriers decreases because two-dimensional electrons are trapped, and that it takes a time for carriers to be released from traps. Some lattice defects may be considered as the cause of forming these traps.

In the first embodiment, a growth temperature for the AlN layer 102x is raised and a V/III ratio is set very high, by ignoring the flatness degree of the AlN surface, which degree has been regarded heretofore as an optimization index. It can be considered that this arrangement can drastically reduce the number of trap centers (crystal defects) in the AlN layer. It can also be considered that the number of trap centers can be reduced in a region grown at the initial growth stage of a GaN film formed on the AlN layer having the large roughness. In other words, the underlying layer having large roughness is effective for reducing trap centers in GaN. As a result, in the structure that an AlN layer and a nitride semiconductor layer are epitaxially grown on a single crystal substrate, roughness is larger at the interface between the AlN layer and nitride semiconductor layer than at the interface between the AlN layer and single crystal substrate. Further, the projections or convex portions are higher at the interface between the AlN layer and nitride semiconductor layer than at the interface between the AlN layer and single crystal layer.

It can be understood that it is preferable to epitaxially grow an AlN layer having large roughness at HT-HR, at least for a GaN containing HEMT for high voltage operation.

Although the GaN containing HEMT of the first embodiment exhibits an excellent performance with a short transient response, it has been found that there arises a problem when a plurality of devices are integrated.

Figure 2C:
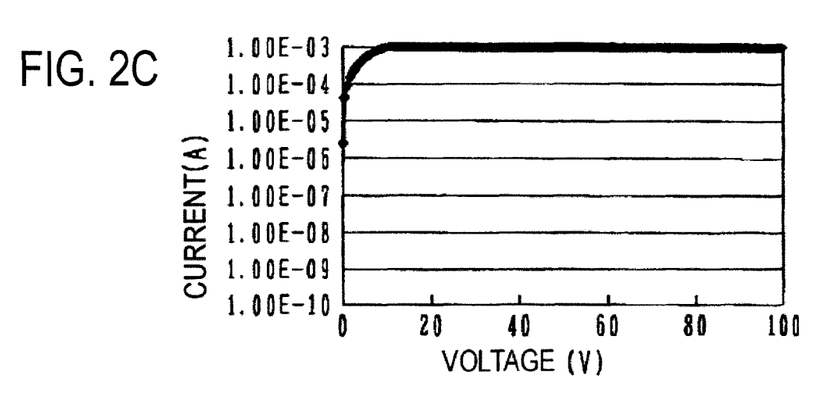
FIG. 2C is a graph showing leak current among integrated elements in the sample according to the first embodiment.

FIG. 2C is a graph showing the monitored results of a current flowing between two GaN containing HEMT's isolated by an isolation trench, when a voltage up to 100 V is applied between a drain of one HEMT and a source of the other HEMT. For preventing the elements from being burnt out, a current value is limited at $10^{-3}$ A. Leak current increases abruptly even at a small applied voltage, and reaches $10^{-3}$ A even at an applied voltage lower than 10 V. Current flows between adjacent elements, and high resistance isolation cannot be obtained. Another problem is that even a single element cannot be turned off completely by a gate voltage.

The reason of this leak current may be ascribed to that while the i-type GaN layer 105 is grown on the AlN layer 102x having large roughness, lateral growth occurs to bury the irregular portions. During this GaN lateral growth, impurities such as Si are likely to be mixed so that crystal resistance lowers.

Figure 4A:
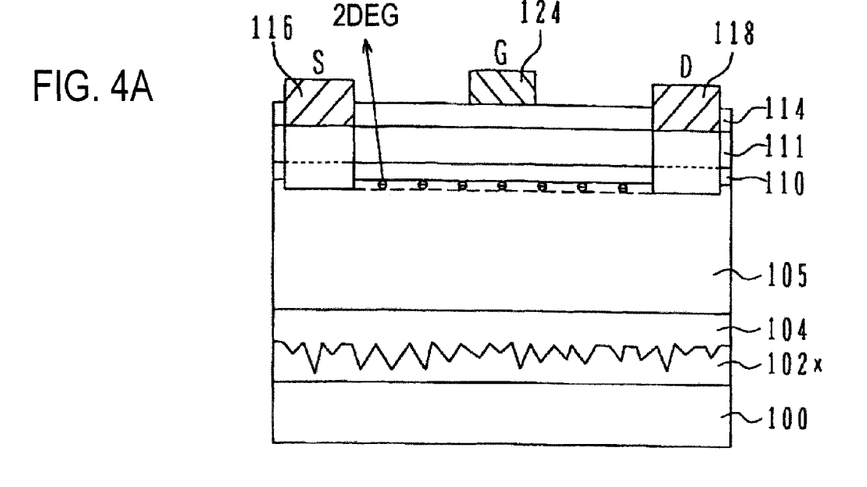
FIG. 4A is a cross sectional view of a GaN containing HEMT according to a second embodiment.

FIG. 4A is a cross sectional view of a GaN containing HEMT according to the second embodiment. By a process similar to the first embodiment, on an SiC substrate 100, an AlN layer 102x of 20 nm to 40 nm thick is epitaxially grown at HT-HR. An AlGaN layer 104 whose Al composition is adjusted to 7 at % is grown on the AlN layer at a growth temperature of 1050±50° C., and thereafter an i-type GaN layer 105 is grown. A thickness of the AlGaN layer 104 is preferably 10 nm to 200 nm, and in this embodiment, is set to 100 nm. The AlGaN layer can easily have a higher resistivity than that of the GaN layer, because of a broadened band gap and the like. The i-type GaN layer 105 and other layers to be formed thereafter have the structures similar to those of the first embodiment.

Figure 4B:
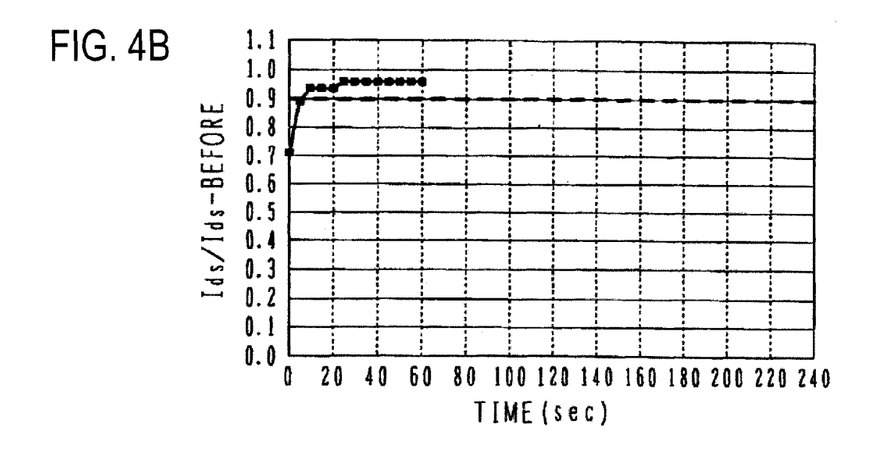
FIGS. 4B and 4C are graphs showing recovery of a drain current after being driven at a high frequency in a sample of the second embodiment, and leak current between adjacent HEMT's.
Figure 4C:
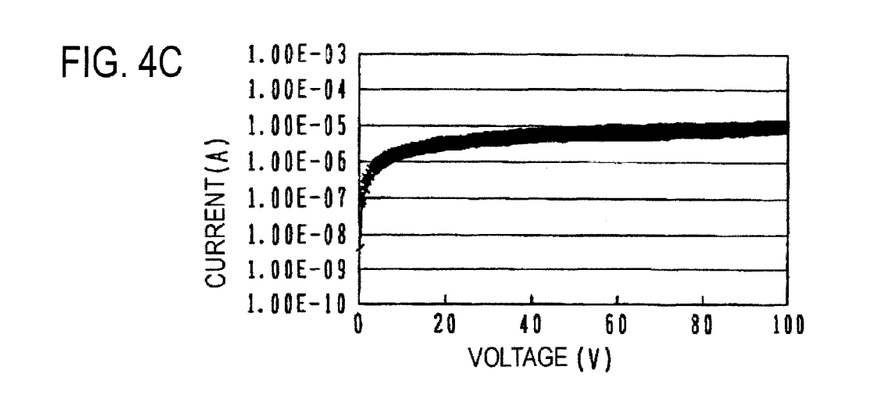

FIGS. 4B and 4C show a measured drain current recovery after being driven at a high frequency in a sample of the second embodiment, and leak current between adjacent HEMT's. The measuring method is the same as that used for FIGS. 2A to 2C. The drain current recovery characteristics shown in FIG. 4B are approximately equal to those shown in FIG. 2A. The leak current shown in FIG. 4C exceeds $10^{-6}$ A at an applied voltage of several volts, and thereafter increases gently. The leak current even at an applied voltage of 100 V is at a level of $10^{-5}$ A. Improvement by about two digits is achieved as compared to the characteristics shown in FIG. 2C. Isolation resistance of a practical level is thus obtained.

In the second embodiment, although AlGaN having an Al composition of 7 at % is used as the leak current preventing high resistance layer, a similar high resistance effect is expected by using $Al_xGa_{1-x}N$ ($0<x\leqq0.1$) (in the notation of Al composition by at %, 0 at %<Al composition$\leqq$10 at %). If the Al composition is low, the high resistance effect is small. Conversely, if the Al composition is made too large to the same degree as that of AlGaN of the current supply layer of HEMT or the like, a thermal conductivity lowers and the element characteristics may adversely be affected. This is the reason why the upper limit of Al composition exists.

In place of the AlGaN layer, an Fe-doped GaN layer may be used. In FIG. 4A, after the AlN layer 102x is epitaxially grown at a high temperature, first, an Fe-doped GaN layer 104 is grown under the GaN growth condition, and thereafter the i-type GaN layer is grown. Fe source may be ferrocene. The GaN layer 104 doped with Fe at $1\times10^{17}$ cm$^{-3}$ to $1\times10^{19}$ cm$^{-3}$ is grown to a thickness of 10 nm to 200 nm and connected to the i-type GaN layer 105. In this case, a thickness of the i-type GaN layer was set to 2.5 μm for fear that Fe may be diffused upward.

The present inventors conducted crystal growth of the AlN layer under various conditions and investigated a relation between a skewness of an AlN layer surface and a drift (recovery) time after interruption of a high frequency signal.

Figure 5:
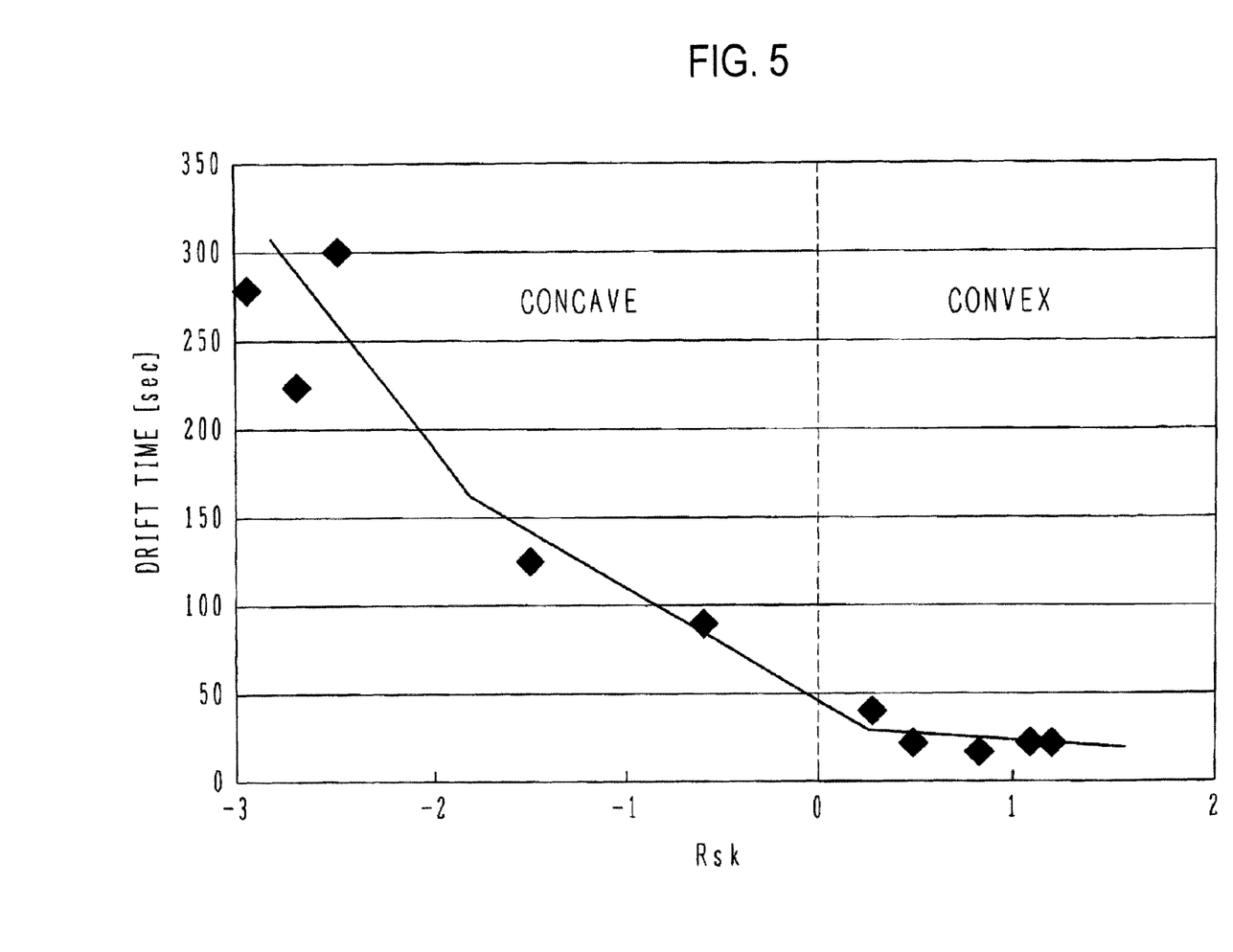
FIG. 5 is a graph collectively showing the measurement results of relation between skewness Rsk of an AlN layer surface and drift (recovery) time after interruption of a high frequency signal.

FIG. 5 is a graph collectively showing the experimental results on the relation of the drift (recovery) time after interruption of high frequency signal with the skewness of the surface of the AlN layer. The abscissa represents a skewness Rsk, and the ordinate represents a drift time in the unit of sec. Rsk changes from about −3 to about 1 (1.2). In the range where the skewness is −3 to 0, the recovery time shortens as the absolute value of the skewness reduces. A recovery time is shorter in the range of a positive skewness than in the negative skewness range. As the surface morphology takes more an upward projection state, Rsk has a larger positive value. It can be seen that as Rsk has a larger positive value, recovery of a transient phenomenon is speeded up. It is seen that in the range of 0 to about 0.4, as the skewness becomes large, the recovery time is shortened distinctly. It is also seen that in the range of 0 to about 1, as the skewness Rsk increases, the drift time is shortened, and as Rsk exceeds about 1, the drift time maintains almost constant. It is therefore preferable to set Rsk not smaller than 0.5, and it is expected that a sufficiently short transient response can be obtained stably if Rsk is set to 1.0 or larger. However, present film forming technologies may not realize a skewness Rsk larger than about 1.5. It can therefore be said that a practical upper limit of the skewness is 1.5.

The present invention has been described in connection with the preferred embodiments. The invention is not limited only to the above embodiments. It will be apparent to those skilled in the art that other various modifications, improvements, combinations, and the like can be made.

What is claimed is:

1. A semiconductor epitaxial substrate comprising:
   a single crystal substrate;
   an AlN layer epitaxially grown on said single crystal substrate; and
   a nitride semiconductor layer epitaxially grown on said AlN layer,
   wherein a skewness Rsk of an upper surface of said AlN layer is positive.

2. The semiconductor epitaxial substrate according to claim 1, further comprising:
   a first device layer of nitride semiconductor epitaxially grown on said nitride semiconductor layer; and
   a second device layer of nitride semiconductor epitaxially grown on said first device layer.

3. The semiconductor epitaxial substrate according to claim 2, wherein said first device layer is a channel layer, said second device layer is a carrier supply layer, and said nitride semiconductor layer has a higher resistivity than said first device layer.

4. The semiconductor epitaxial substrate according to claim 1, wherein said single crystal substrate is made of SiC.

5. The semiconductor epitaxial substrate according to claim 1, wherein said AlN layer has a thickness equal to or less than 40 nm.

6. The semiconductor epitaxial substrate according to claim 1, wherein the upper surface of said A1N layer has protrusions of a width less than 200 nm, and projections having a height less than 3nm with respect to an average height.

7. The semiconductor epitaxial substrate according to claim 1, wherein the skewness Rsk is in a range from 0.5 to 1.5.

* * * * *